United States Patent
Ireland

(10) Patent No.: US 6,747,579 B1
(45) Date of Patent: Jun. 8, 2004

(54) VARIABLE WHISTLE PITCH CONTROL FOR MODEL TRAIN LAYOUTS

(75) Inventor: Anthony J. Ireland, Norcross, GA (US)

(73) Assignee: Digitrax Inc., Norcross, GA (US)

( * ) Notice: Subject to any disclaimer, the term of this patent is extended or adjusted under 35 U.S.C. 154(b) by 566 days.

(21) Appl. No.: 09/850,385

(22) Filed: May 7, 2001

(51) Int. Cl.[7] .............................................. H03M 11/00
(52) U.S. Cl. .......................... 341/34; 341/20; 246/183; 246/187 A; 446/297; 446/467; 400/481; 200/341; 200/520
(58) Field of Search .............................. 341/20, 22, 34; 246/3, 6, 167 R, 187 A, 183, 182 R; 446/297, 467; 105/1.5; 400/481; 200/341, 520

(56) References Cited

U.S. PATENT DOCUMENTS

| | | | | |
|---|---|---|---|---|
| 3,568,183 A | * | 3/1971 | Snell et al. ................... 341/27 |
| 4,521,712 A | * | 6/1985 | Braun et al. ................. 310/339 |
| 5,174,216 A | * | 12/1992 | Miller et al. ................. 104/296 |
| 5,434,566 A | * | 7/1995 | Iwasa et al. ................... 341/34 |
| 5,855,004 A | * | 12/1998 | Novosel et al. ............. 704/272 |
| 6,040,823 A | * | 3/2000 | Seffernick et al. ........... 345/168 |
| 6,457,681 B1 | * | 10/2002 | Wolf et al. ............. 246/187 A |
| 6,509,847 B1 | * | 1/2003 | Anderson .................... 341/34 |
| 6,509,848 B1 | * | 1/2003 | Ogata et al. ................... 341/34 |
| 6,607,442 B2 | * | 8/2003 | Ogata et al. ................... 463/37 |
| 6,617,982 B1 | * | 9/2003 | Ogata et al. ................... 341/34 |

* cited by examiner

Primary Examiner—Albert K. Wong

(57) ABSTRACT

New techniques are presented for providing proportional activation of model railroad functions with control keys. This permits for example a compact throttle device connected to a digital layout control system to provide for a "playable" or variable-pitch whistle sound effect where prior art was severely limited in providing this effect realistically. This invention allows multiple proportional keys in a cost-effective manner that is compatible with existing keyboard designs.

20 Claims, 2 Drawing Sheets

VARIABLE WHISTLE PITCH CONTROL FOR MODEL TRAIN LAYOUTS

BACKGROUND OF INVENTION

Figure 1:
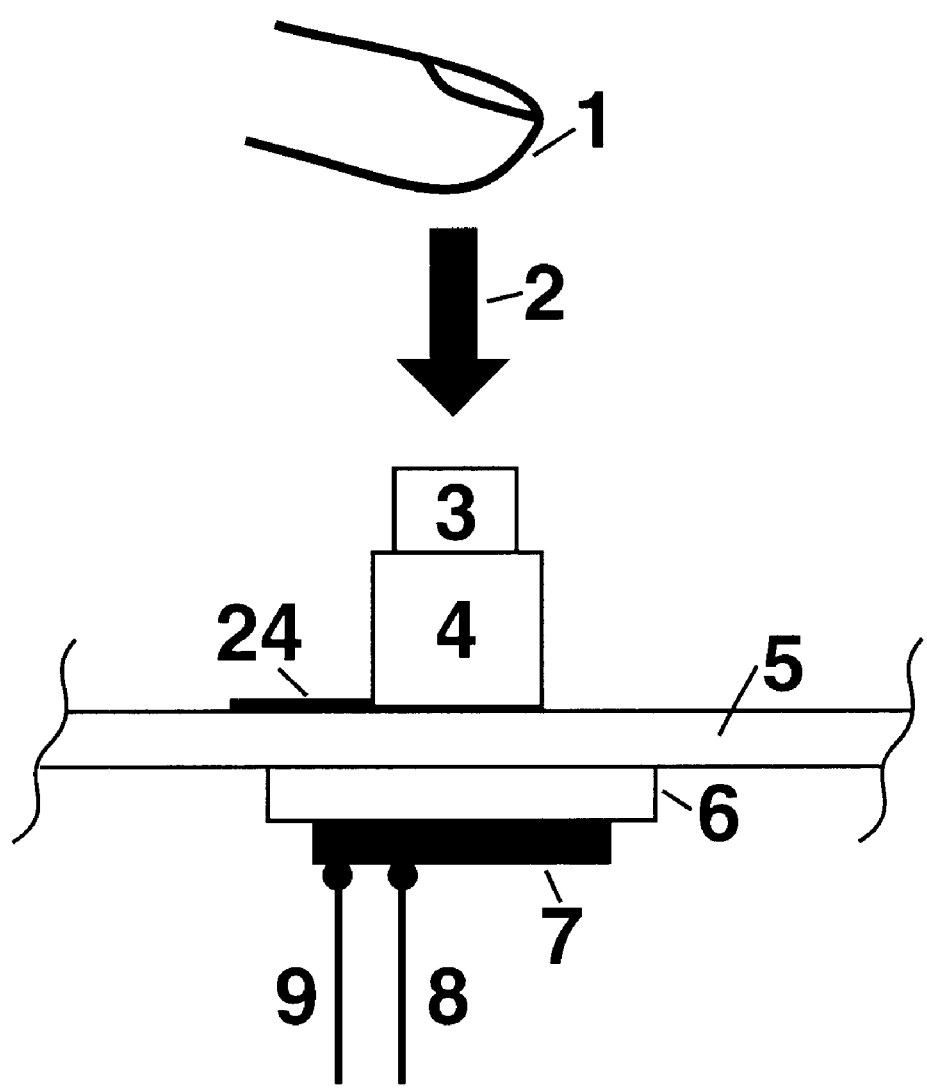

This invention pertains to the field of control systems for scale model railroad layouts, and specifically to improvements in control of whistle sound effect generation capabilities.

The era of prototype steam-powered locomotives carrying significant railroad tonnages has passed, but nostalgic model railroaders enjoy the sounds of "live steam" on model railroad layouts. In addition to steam "chuff" sounds of moving steam locomotives, bell and steam whistle effects are particularly favored by modelers.

A steam powered locomotive whistle is very distinctive, and many new innovations in model railroad sound systems strive to provide realistic and controllable whistles on scale model railroad layouts. Examples of this would be modern DCC controlled sound decoders from Soundtraxx Inc. and ESU Electronics. Novosel et al, in U.S. Pat. No. 5,855,004 show us the benefit of digitally generated sounds in locomotive decoders, and follows prior work done by pioneers such as Soundtraxx and others.

On non-digital or conventional analog DC controlled model railroads the Pacific Fast Mail or PFM sound system has been very popular and creates very realistic sound images that are synchronized to the motion of the model locomotives, particularly narrow-gauge models. A favorite PFM sound effect is a "playable" or variable pitch steam whistle, which recreates the action of a prototype engineer varying the whistle steam valve to modulate the steam whistle pitch, harmonics and intensity. This provides a lot of realistic "character" to the operation of a model locomotive. The PFM system effects the playable whistle with a hand operable pivoting whistle pitch control lever on the control unit. In the rest position this whistle pitch control lever ensures that no whistle sound is generated. As the lever is actuated and its angle is changed the whistle sound effect is generated and is modified in pitch proportionally to the lever angle. Thus moving the lever up and down allows the generation of a controllable, continuously variable and playable whistle.

In the PFM design the sounds created in this manner are conducted from the control unit via the layout rails to a speaker mounted in the locomotive, and optionally to speakers mounted around the layout. This arrangement permits a single high quality sound system for one train on the rails connected to a single control unit. Several other sound control units exist, for example units from Model Rectifier Corporation and Chicago International that employ slider controls to allow a modeler to create a playable whistle on a conventional DC model railroad layout.

To date the only variable pitch whistle effects that have been introduced into digitally controlled model railroads are within the Marklin GmbH 1-Guage sound units on layouts controlled by their digital control system. In this system an accessory control key associated with whistle control is depressed on the control unit, or throttle, that activates the whistle in the digital sound generator in the model locomotive, and is also used to indirectly control a variable whistle pitch. After the locomotive whistle is activated by the whistle key depression, the whistle pitch begins to change in the digital sound generator in a manner controlled in proportion to the time the key is depressed. This provides a controllable whistle pitch with the standard Marklin control system components, but lacks the impression of continuously variable pitch that a lever or slider control creates. This Marklin control method, since it is a digital control system, has the desirable advantage that it permits the realistic operation of a multiplicity of whistle equipped digital locomotives in the same area of layout tracks. In this manner the prior art provides playable whistle effects, but with limitations in all the implementations.

This invention overcomes the limitations of prior user interfaces on model railroad digital control systems and provides for a more realistic feeling variable whistle control feature. This invention allows existing accessory control key array designs to be upgraded to add proportional Z-axis or force measurement localized or explicitly attached to any existing individual keys. This allows the improved proportional control of any feature controlled by such upgraded accessory control keys. This is of great benefit to expanding the control capability of user interfaces for digitally controlled model railroads.

Computer input devices have been developed to a fine, art with examples such as Parsons in U.S. Pat. No. 5,287,089 and Ono et al. U.S. Pat. No. 5,555,004. All this work is aimed at providing force sensitive computer input pointing devices that are fully integrated as a device that is manufactured as a single assembly. These mechanisms are not designed as an adjunct or upgrade to add capabilities to an existing conventional key array structure. The implied or derived force measurement is used to provide X and Y position or a selection click or double-click as a user input, and is not localized to attaching extra sense capability to any single key in a key array.

SUMMARY OF INVENTION

For model layouts using digital control systems the fundamental problem for allowing realistic playable whistle effect is that the user input or control devices such as throttles have all been designed for binary state or on-off actuation of accessory function devices on the layout. Prior art digital control designs have made no provision for throttles to have proportional actuation of accessory function controls, excepting that rotary knobs or slide controls are allocated for locomotive speed control. It is possible to mount a control lever or slider on a throttle for proportional actuation accessory control but these require extra space and add extra cost, as they are additional to the standard controls that have been heretofore provided.

Prior art railroad digital control systems associate sound controls with a small array of general-purpose on-off accessory function keys or switches on the input device or throttle. This has been sufficient to date to allow a repertoire of sounds to be controlled. For example accessory function keys are individually allocated to simply toggle on or off a bell, coupler clank noise, steam dynamo, steam cylinder blow-down and other discrete effects. This array of accessory function keys for controlling effects needs to be redesigned to permit proportional control input actuation capability.

A proportional control actuation key capability may be awkward to implement, and needs to fall within the control format of the overall accessory key array, so that for example, a steam whistle effect function key on one locomotive may be used for some other feature on a different type of locomotive that has no whistle but needs available function controls for other features. It is undesirable to allocate and specially build a non-array key that is only associated with a single type of capability.

The solution to this problem that this invention employs is to add an extra dimension of controllability to the accessory function switch array by allowing a Z-axis or force normal to a function key to be used as an analog or continuous input associated with that key. This means that the pressure exerted by a fingertip on a key may be used to both start an accessory function active and also then be used to vary the same accessory function by applied pressure changes. This provides a variable control input capability while allowing the key to be a standard unit within a standard function key array.

There are a number of everyday items that permit proportional control by a human hand. For example; a computer game joystick, a force sensitive eraser-head pointing device added between keys in a computer keyboard and a force sensitive touch pad computer pointing device. All these common examples differ from this invention in that the proportional force sensing capabilities are specialized devices, and are not used to upgrade a force insensitive general-purpose control switch array to a higher level of control capability.

This invention specifically is used to add Z-axis sensing capability to a key array design without Z-axis sense capability. This may be applied selectively to either a single key or any number of keys in the array. This feature is of value since it permits the selective design upgrade of a standard or inexpensive key array, or array of same types of key devices, to have a new and useful proportional control capability. The addition of proportional control capability is accomplished within the footprint of the key array so outwardly to the human interface there is no need for extra tooling or package design changes to the exterior of the enclosure supporting the keys.

ATTACHED DRAWINGS: (2 sheets)

FIG. 1 details the typical physical arrangement of the preferred embodiment

Figure 2:
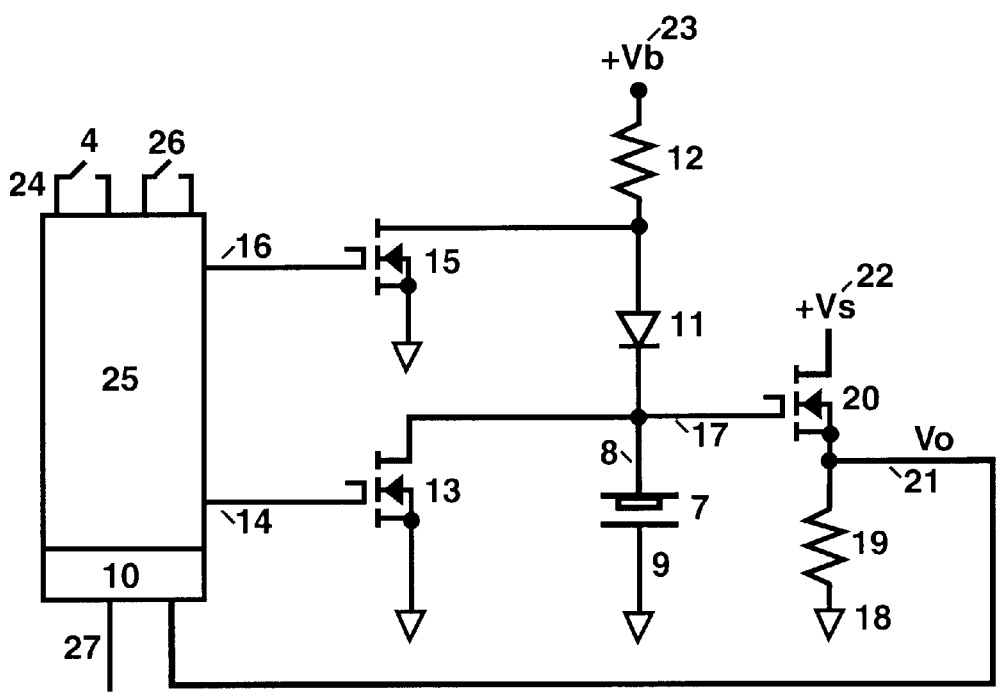

FIG. 2 details a electrical schematic of the preferred embodiment

DETAILED DESCRIPTION OF INVENTION

FIG. 1 depicts the key elements of the physical arrangement of the preferred embodiment of the invention in a user input device, or throttle, for a digital model railroad control system. Item 1 represents the actuating finger of a human user. The arrow, item 2, shows the direction of the force applied by the actuating finger and the arrow pointing direction is considered the Z direction axis. Item 3 is the key element that is touched by the finger, 1, and the associated electrical contact switching part of the key is shown as 4. A minimum force is required to actuate item 4 to provide an actuation signal on connection 24 and, while activated the applied force continues to be applied to 3 and 4 and may be increased. Items 3 and 4 are intimately related as a single key switch instance, and typically a key array has a number of these key switches arranged in the X and Y plane perpendicular to the shown Z-axis. The key switch mounting substrate is shown as 5 and is typically a printed circuit board in the X/Y plane or some other form of substrate for key switch mounting. A substrate deflection-measuring or force sensing sensor means, 7, is attached to the substrate 5 by an force transmitting attachment material 6 in an orientation so as not to interfere with key switch action and permit force sensing. The attachment means 6 is chosen to be compatible with the substrate 5 and the sensor 7 and may be for example; an adhesive or solder or like material. Connections 8 and 9 represent the means for conducting the proportional output of sensor 7, related to force sensed, to conditioning electronics as shown in FIG. 2.

The key switch mounting substrate, 5, has a finite compliance and there is a resulting key switch mounting substrate deflection when a force is transmitted from the finger, 1, via key switch instance, 3 and 4. The substrate deflection-measuring sensor, 7, provides an electrical output when substrate deflection occurs due to key switch pressure or force. Sensor 7 may in fact sense deflection caused by force on any actuated key switch in a group or array on its surface, and this deflection magnitude sensed is modified or scaled by the distance the key switch is from sensor 7, and the deflection characteristics of the substrate. In this discussion the deflection of the substrate and sensor is caused by the force to be measured so the terms force and deflection are used interchangeably in this context.

An important aspect of this invention is that the sensed deflection is related to or is qualified by a particular actuated key switch instance in a group. This is possible because the initial actuation of key switch 3 and 4 informs the attached control logic means 25 in FIG. 2, via connection 24, which particular key switch has been depressed. The conditioned or amplified output of sensor 7, Vo or item 21, may then be selected via input selector 10 and processed as a varying value by control logic 25 to be understood as a force value associated with the actuated key switch. Item 25 contains the logic, and possibly software, to perform the necessary processing and includes at least; a means of addressing or scanning for actuated key switches, controlling the force sensor conditioning electronics, a means such as an analog to digital converter or other data converter method to evaluate the force sensor voltages and the means to communicate proportional commands derived from key switch actions to the rest of the model railroad control system.

The outputs of control logic 25 are commands and control information resulting from the user's key switch actions that are appropriately configured for the rest of the control system and conducted to that system by a means that is not shown here. The details of the output connection means and proportional commands from 25 to the rest of the control system are adaptable to each type of control system and are not central to the operation of the key Z-axis sensitive proportional actuating capability of this invention.

In accessory function actuation usage for model railroad control, only a single key switch in the array is pressed at once, so it is possible to localize the meaning of the force sense measurements to the active key switch and do this consecutively for different key switches. When key pressure is released key switch actuation output from 4 indicates this to the control logic 25 so force measurement is ended and the key switch inactive commands may be generated to the control system.

If different groups of key switches have a single member that need to be active at the same time, then it is sensible to provide a separate instance of deflection sensor 7 for each key switch group. This allows the control logic 25 to process via input selector 10 a multiplicity of independent sensors and simultaneous key switch actuations in different groups. To minimize deflection sensor cross talk between different key switch groups it is advantageous to modify the substrate deflection characteristics to mechanically isolate force coupling between key groups. This may be simply done by cutting isolation channels or slots in the substrate between the key groups, or some similar method to isolate or modify the substrate force transmission characteristics. In this way it is possible to tailor the sense measurements to the desired key switch layout. If only a single sensor 7 is used then clearly input selector 10 devolves to selecting a single force sensor output.

The deflection sensor employed for 7 may be any one of the many well known devices that provide a proportional output related to strain or deflection coupled to them. To avoid the complex and sensitive electronic conditioning required for conventional resistive strain gauges, it is advantageous to employ a high output piezoelectric crystal device as a force or deflection sensor in this invention. Piezoelectric devices are conventionally employed as sound transducers, both for generation and reception of acoustic energy, as solid state accelerometers and as pickup sensors for gramophone records. These devices are inexpensive and are readily configurable for an unconventional use in this invention and have the advantage of having high sensitivity and output as a force sensor.

Some throttle devices benefit from, and strive for, a compact design so as to be easy to hold in the hand. The usage of a piezoelectric sensor in this invention also permits the valuable dual-usage of the sensor 7 as a both a force sensor and as an acoustic generator for aural feedback. This novel dual-usage capability of the invention allows for cost and space savings, since a separate sound generator is not required.

FIG. 2 is a preferred embodiment of the electrical arrangement, or schematic, of the invention. Force or deflection sensing piezoelectric element 7 is coupled by connections 8 and 9 to the conditioning electronics sense node 17 and reference or ground node 18. The output of the piezoelectric sensor is a high impedance, so buffer transistor 20 is employed so that output voltage, Vo, developed across resistor 19 and on link 21 is isolated and does not load sensor 7. The buffer transistor 20 is shown as an insulated gate n-channel MOSFET device, but a bipolar transistor or a high input impedance analog amplifier could also perform this function. The buffer transistor is powered from a supply voltage Vs, item 22, that is chosen to provide an appropriate voltage range to be routed by connection 21 and input selector 10 and then to control logic 25.

A piezoelectric crystal develops voltages when the crystal lattice undergoes deformation and these are picked up on conductive electrodes on the surface. Since the crystals are essentially insulating in nature this voltage appears to be very high impedance or electrostatic in nature. Because of surface contamination or defects in the crystal, a static deflection will result in the deformation-induced voltages decaying slowly in time. This means that the crystal output voltage will typically decay slowly over several seconds or appear to have low frequency cut-off or DC output drift.

To overcome this problem this invention employs an electrical precharge or voltage bias Vb, item 23, on the piezoelectric sensor 7. Low reverse leakage diode 11 and resistor 12 are employed to precharge sensor 7 to the bias supply Vb, item 23. When the associated key switch 4 actuation scanned by control logic 25 indicates that sensor 7 is required to be sensing Z-axis force, then control line 16 from control logic 25 is asserted to make transistor 15 conducting. This has the effect of isolating the bias voltage Vb from sensor 7 through a now reverse biased low-leakage diode 11. The voltage developed by 7 from sensing substrate deflection is configured in polarity for the finger force direction, 2, shown in FIG. 1 to be opposite in polarity from the positive bias voltage Vb. This means that an increasing force sense voltage will be negative across the precharged sensor 7 and will act to lower the voltage on connections 8 and 9 in proportion to the applied force. This lowered voltage is at sense node 17 and is then buffered by 20 to the rest of the electronics. The control logic 25 acts to correctly sequence the control needed to scan the switches 4 and measure and interpret the varying voltage derived from sensor 7.

If control logic 25 determines that key 4 as been actuated for a long enough period to permit a predefined amount of sensor voltage decay, then it may perform another precharge of the sensor, 7, and still continue operation. Subsequent precharges may be correctly accounted for by noting that the finger force cannot vary much within the typical millisecond period used for a precharge of 7. Thus the measured voltage values before and after the precharge must effectively represent the same force, so the control logic 25 can correctly associate these two measurements in a continuous manner and present an output measurement that has been compensated or corrected for sensor voltage decay. This correction process of the invention overcomes the limitations of the piezoelectric sensor by effectively providing for a DC level restoration and steady voltage output from an inherently unstable DC drifting sensor.

Control line 14 is employed to control low output-leakage transistor 13 to create a sound output when the sensor 7 is not being used for force measurement. When not measuring force, transistor 15 is non-conducting which allows precharge of sensor 7 via 11 and 12. In this state a sequence of timed on and off conduction periods of transistor 13 will create a sympathetic varying voltage, swinging from approximately zero volts to Vb, across sensor 7. The value of Vb has been chosen to be sufficient for this AC voltage to provide an acoustic or sound output from sensor 7. The conduction periods of 13 and timing are chosen to provide a suitable tone and duration of the sound or beep. The coupling of sensor 7 to the substrate by 6 ensures that when acting as a sound transducer the sound energy is effectively conducted into the substrate and environment of the throttle unit.

The preferred embodiment shown in FIG. 2 is not intended to limit the means of implementing the essence of this invention. There are numerous circuit arrangements that can perform the processing steps and overall function of this invention and still employ the concepts shown herein. The usage of the proportional commands generated by this invention is not intended to be limited solely to whistle pitch control.

In FIG. 2 the value of Vb is typically chosen to be in the range of +8 to +16 volts DC. This provides a sufficient voltage for loud sounds to be generated by typical piezoelectric devices such as a disc element in the range of 12 mm to 30 mm. The schematic of FIG. 2 is specifically crafted in a manner so minimum supply current is consumed when no key actuation or sound generation is occurring.

Since the piezoelectric element has effectively bilateral transformation characteristics, a given output force or deflection will result for a set input voltage as a transducer and vice-versa as a sensor. Thus the voltage range for sensing and sound generation can be configured for good performance with inexpensive control electronics.

Accordingly the circuit of FIG. 2 may be easily configured with an appropriate piezoelectric sensor to operate with a single logic driver device that incorporates a high-impedance third operating state or tri-state output. In this way, a tri-state gate operating in its normal driven high and low state can connect to leads 8 and 9 of sensor 7 and drive it with a sound generating square wave of the amplitude of its logic supply, for example +5 volts for a CMOS logic device. Driving the logic output high also performs the precharge function and then immediately switching the logic output to the high-impedance or ti-state level then permits force sensing. The sense node 17 is still buffered by 20 or any other equivalent high impedance amplifier. If the proportional output voltage of sensor 7 is too low, then the buffer device 20 may also be reconfigured with additional components to provide any needed voltage amplification as well as high impedance buffering.

Note that with this configuration it is also possible for the precharge to operate by driving the terminals 8 and 9 to a zero volt level with a logic output low level. In this case the sensor connections 8 and 9 are reversed so that an applied force creates a positive voltage at node 17. Here control logic 25 can measure the force voltage directly referenced to ground and does not need to subtract the offset of the bias voltage Vb.

In addition to the alternate use of logic gate devices noted, logic controlled low-leakage analog bilateral switch devices may be employed by anyone skilled in the art of analog electronics design to generate the precharge voltages and sound-generating voltages, as performed by devices 13 and 15 in FIG. 2. These same analog bilateral switches may also be employed in the input selector 10 to perform the voltage selection or multiplexer function. If input selector 10 has low leakage and high input impedance suitable for the sensor employed, then the buffer stage 20 and 19 may be eliminated and sense node 17 may be coupled by connection 21 directly into 10. These variations may be useful to cost-reduce the electronics needed when a multiplicity of force sensors are used to create more than a single proportional control key.

With an array of piezoelectric sensors in different groups of key switches it may not be necessary for all sensors to generate sound. In this case only the pre-charge and buffer capability are needed for units that do not make sound. In this configuration input selector 10 is used to select the appropriate sensor voltage when an associated key switch is actuated. The extra conditioning electronics employed by each sensor instance is not shown here since it simply is a-repeat of the electronics presented here. Extra control items performing the function of 16 and 14 for extra force sensors are likewise not shown since they are simply repeated as extra outputs from control logic 25 as needed.

Item 26 represents a second key switch actuation input associated to a second sensor unit and additional conditioning electronics with a voltage sensor output 27, connected via input selector 10 to the control logic, 25. When 26 is actuated, control logic 25 selects the associated sense voltage via input selector 10 and can time-share and sequence its processing capabilities amongst a multiplicity of force sensors to provide multiple proportional control keys.

If a multiplicity of key switches is to be associated with a single force sensor, 7, then it is advantageous to calibrate the force coupling strength of each key switch so that all key switch pressures may be equalized in the proportional control values sent to the layout control system. This may be performed at manufacture by applying calibrated forces to each key switch in turn and having the control logic 25 measure the force voltages generated, calculate appropriate calibration constants that allow force measurement normalized to the reference forces, and then save these in a non-volatile memory. These calibration constants are fairly repeatable for units manufactured with reasonable tolerances, so the calibration performed on a reference unit may usually applied to other units manufactured in the same process. In this manner the required accuracy and control range may be obtained from the force sensing key switches.

A novel possibility is to build the key switch array purely with force sensing switch elements. In this variation we merge the key switch actuating function, 4, with the force measurement function, 7, in each key instance into single outputs that are conditioned and then selected by input selector means 10 and processed by the control logic, 25. A key actuation decision is made by a force threshold decision means within control logic 25 by setting a threshold force level to signify initial key action. Subsequent forces above the threshold level then are interpreted to be proportional control inputs. The invention methodology applies the same procedures for proportional command generation with this key construction method. It is possible to still generate sound, and a precharge cycle may also be employed if a suitable transducer is employed. Mechanical isolation may not be needed on the key mount substrate since the force sensors in this arrangement are only coupled to the switch they are used to measure forces on.

What is claimed:

1. A method for generating proportional commands from a control key means on a digital model railroad control system, comprising;
   a) providing said control key means, comprising:
      (i) a key switch means with an output actuation when there is force applied, attached to,
      (ii) a force sensing means for providing an output that is proportional to said force applied to said key switch means,
   b) providing a control logic means that uses said output actuation of said key switch means to control creation of said proportional commands in combination with said output of said force sensing means and to conduct said proportional commands to said digital model railroad control system, whereby said proportional commands may be generated in response to varying said force applied to said control key means.

2. The method defined in claim 1 wherein a grouped multiplicity of said control key means are coupled to said control logic means that permits said proportional commands to be uniquely generated for the actuation of each instance of said control key means.

3. The method defined in claim 2 wherein a multiplicity of said grouped multiplicity of said control key means are coupled to said control logic means that permits simultaneous said proportional commands from one instance of said control key means in each said grouped multiplicity of said control key means.

4. The method defined in claim 1 wherein said control key means is provided with calibration constants to provide a normalized force response.

5. The method defined in claim 1 wherein said control key means are mechanically isolated to minimize deflection sensor cross talk from other control keys not associated with said force sensing means of said control key means.

6. The method defined in claim 1 wherein said force sensing means is a piezoelectric device.

7. The method defined in claim 1 wherein DC output drift in said force sensing means is be removed by consecutive precharge and correction cycles.

8. The method defined in claim 1 wherein said force sensing means also generates sound output under the control of said control logic means.

9. The method defined in claim 1 wherein said proportional commands allow the control of whistle pitch in a sound effect generator.

10. The method defined in claim 1 wherein said proportional commands allow the control of a sound effect from the group consisting of: a bell, coupler clank noise, steam dynamo, and steam cylinder blow-down.

11. The method defined in claim 1 wherein said force sensing means senses force in the z-axis.

12. The method defined in claim 1 wherein said force sensing means is a resistive strain gauge.

13. A method for generating proportional commands from a control key means on a digital model railroad control system comprising;
   a) providing said control key means comprising:
      (i) a key means with a proportional output when there is force applied,
      (iii) a force threshold decision means for providing a decision output when the force applied to said key means exceeds a predetermined actuation threshold,
   b) providing a control logic means that uses said decision output of said force threshold decision means to control creation of said proportional commands in combination with said proportional output of said key means and to conduct said proportional commands to said digital model railroad control system,
whereby said proportional commands may be generated in response to varying said force applied to said control key means.

14. The method defined in claim 13 wherein said proportional commands allow the control of whistle pitch in a sound effect generator.

15. The method defined in claim 13 wherein said control logic means is provided with calibration constants to provide a normalized force response.

16. An apparatus for generating proportional commands for a digital model railroad control system comprising:
   a) control key means comprising:
      (i) a key means with a sensor for generating a proportional output when there is force applied,
      (ii) a force threshold decision means for providing a decision output when the force applied to said key means exceeds a predetermined actuation threshold,
   b) a control logic means that uses said decision output in combination with said proportional output to create said proportional commands for said digital model railroad control system,
whereby said control logic means generates proportional commands in response to varying said force applied to said control key means.

17. The apparatus defined in claim 16 wherein said proportional commands controls the whistle pitch in a sound effect generator.

18. The apparatus defined in claim 16 further comprising a multiplicity of said control key means that are coupled to said control logic means to permit said proportional commands to be uniquely generated by the actuation of each control key means.

19. The apparatus defined in claim 18 wherein said control logic means permits simultaneous proportional commands for each control key means.

20. The apparatus defined in claim 16 wherein said control logic means is provided with calibration constants to provide a normalized force response.

* * * * *